(12) United States Patent
Cheng et al.

(10) Patent No.: US 6,704,216 B1
(45) Date of Patent: Mar. 9, 2004

(54) DUAL MATCH-LINE, TWIN-CELL, BINARY-TERNARY CAM

(75) Inventors: Paul Cheng, San Jose, CA (US); Nelson L. Chow, Mountain View, CA (US)

(73) Assignee: Integrated Silicon Solution, Inc., Santa Clara, CA (US)

( * ) Notice: Subject to any disclaimer, the term of this patent is extended or adjusted under 35 U.S.C. 154(b) by 1 day.

(21) Appl. No.: 10/064,770

(22) Filed: Aug. 15, 2002

(51) Int. Cl.[7] ................................................ G11C 7/00
(52) U.S. Cl. .................... 365/49; 365/203; 365/204; 365/202; 365/189.07; 365/51
(58) Field of Search ..................... 365/49, 202, 203, 365/204, 189.07

(56) References Cited

U.S. PATENT DOCUMENTS

| | | | |
|---|---|---|---|
| 5,072,422 A | 12/1991 | Rachels | 365/49 |
| 6,101,115 A | 8/2000 | Ross | 365/49 |
| 6,108,227 A | 8/2000 | Voelkel | 365/49 |
| 6,147,891 A | 11/2000 | Nataraj | 365/49 |
| 6,163,473 A * | 12/2000 | Hannum | 365/49 |
| 6,166,939 A | 12/2000 | Nataraj et al. | 365/49 |
| 6,191,969 B1 * | 2/2001 | Pereira | 365/49 |
| 6,362,992 B1 | 3/2002 | Cheng | 365/49 |
| 6,373,739 B1 * | 4/2002 | Lien et al. | 365/49 |
| 6,385,070 B1 * | 5/2002 | Peterson | 365/49 |
| 6,430,074 B1 * | 8/2002 | Srinivasan | 365/49 |
| 6,442,090 B1 * | 8/2002 | Ahmed et al. | 365/207 |
| 6,477,071 B1 * | 11/2002 | Edman et al. | 365/49 |
| 2002/0145452 A1 * | 10/2002 | Ahmed et al. | 327/52 |
| 2003/0072171 A1 * | 4/2003 | Rhee et al. | 365/49 |
| 2003/0161194 A1 * | 8/2003 | Ma et al. | 365/200 |

* cited by examiner

*Primary Examiner*—Viet Q. Nguyen
(74) *Attorney, Agent, or Firm*—Raymond E. Roberts; IPLO Intellectual Property Law Offices

(57) ABSTRACT

A content addressable memory (CAM)(10, 102) and method having a data-in sub-circuit (44), memory cells (16, 18), a match-high line (36), a match-low line (38), and pre-charge devices (40, 42). Input lines (30, 32, 48, 50) from the data-in sub-circuit (44) are not necessarily discharged to ground in every cycle of a clock signal (62) used by the memory cells (16, 18). Further, the pre-charge devices (40, 42) may be operated at one half of the rate of the clock signal (62). Yet further, the CAM (10, 102) may be selectively configured to operate in either binary or ternary mode.

26 Claims, 8 Drawing Sheets

DUAL MATCH-LINE, TWIN-CELL, BINARY-TERNARY CAM

BACKGROUND OF THE INVENTION

1. Technical Field

The present invention relates generally to static information storage and retrieval systems, and more particularly to associative memories, which are also referred to as content or tag memories.

2. Background Art

In a content addressable memory (CAM), an input word (the data-in word) consists of an ordered group of K bits which is compared bit-by-bit with a plurality of stored words in the CAM. If all of the bits of one of the stored words match those of the data-in word, the address of that stored word is output to the user. Sometimes more than one stored word matches the data-in word. In this case, usually only one address is output, based on a pre-specified priority criterion.

On the other hand, in many cases not all bits need to match when such comparisons are performed. Some bits in a stored word may then be masked out, and not compared with the corresponding bits in the data-in word. It is considered a legitimate match here if the stored word matches the data-in word for all but the masked bits. Technically, a masked bit always returns a match condition so that it does not affect the overall result.

A CAM wherein stored words must be compared bit-by-bit without exception is called a binary CAM, and its memory cells have two logic states: a "0" state and a "1" state. In contrast, a CAM that allows stored words to have masked bits is called a ternary CAM. The memory cell of a ternary CAM has three logic states: a "0" state, a "1" state, and a "DON'T CARE" state that returns an unconditional match.

FIG. 1 shows a typical stored word in a binary CAM. It consists of a row of SRAM cells having differential outputs DSk and DSkB (DSk bar) which are compared with corresponding differential data-in lines Dlk and DlkB through a comparator. The set of connections for the comparator logic, also commonly termed a logic comparison function, is equivalent to (DSk*DlkB)+(DSkB*Dlk)=DSk(+)Dlk, which is effectively an EXCLUSIVE OR function. At the beginning of each compare cycle a match line (ML) is pulled high by connection to a voltage source $V_{DD}$ via a pre-charge gate (MP0; typically a PMOS device), and all of the data lines Dlk and DlkB, where k=1 ... K, are held low. The pre-charge gate is then turned off, leaving the match line floating. At the same time the Dlk data lines are driven by the input data. If DSk=Dlk then DSk (+)Dlk=0 and the cell k leaves the match line alone. This is a match condition.

On the other hand, if DSk≠Dlk then DSK(+)Dlk=1 and one of the series pairs of pass-gates (typically NMOS devices) will conduct and discharge the match line to ground. This is a non-match condition. Since it takes only one non-matched cell to discharge the match line to ground, a word is said to match with the data-in word if DSk=Dlk for all k=1 ... K. That is if the match line stays high. Since all cells are counted in the compare here this is a binary CAM. The two states of the cell are: a "1" state with DSK=1 (high) and DSkB=0 (low); and a "0" state with DSK=0 and DSkB=1.

FIG. 2 shows a typical stored word in a ternary CAM. Since the memory cell of a ternary CAM needs three states, two SRAM cells sharing a comparator form a ternary cell. There are now three usable states: a "1" state, with DS1=1 and DS2=0; a "0" state with DS1=0 and DS2=1; and a "DON'T CARE" state with DS1=DS2=0. The data-in lines Dl and DlB are connected in the same fashion as in FIG. 1, forming an EXCLUSIVE OR logic function. The pre-charged match line (ML) stays high if Dl1=1 and the cell is in the "1" state or Dl1=0 and the cell is in the "0" state. When the cell is in the "DON'T CARE" state, with both series pairs of pass-gates cut off and preventing the match line discharging to ground, a match condition is guaranteed and the cell has no effect on the overall result. Notice that the DSk and DSkB outputs of all odd numbered SRAM are the mirror images of the associated even numbered SRAM for easy layout.

As can be seen by comparing FIG. 1 and FIG. 2, the only difference between a binary CAM cell and a ternary CAM cell is that in a ternary cell a single comparator is shared by two SRAM cells. Most ternary CAM on the market today uses this configuration to save die area and to simplify component connection. Such CAM can still be used as a binary cell, but then the die area is not used efficiently, because two SRAM cells are being used to hold only one bit of data.

Another major concern regarding the efficient use of CAM is power consumption. As those skilled in the electronic arts well know, reducing power consumption is generally desirable in a circuit. However, in CAM it is an increasingly concern because CAM is often used in portable, battery operated devices and the consumption of power relates directly to how long such devices can be operated. Any reduction in CAM power consumption is therefore a highly desirable benefit.

FIG. 3 depicts a logical approach, based on industry trends, to achieving a binary-ternary CAM. It should be noted, however, that the present inventors do not know of any products actually using this approach. FIG. 3 is included here as a useful comparison to the present invention. Yet another manner of achieving binary-ternary CAM, and one which takes a much different approach, is described in U.S. Pat. No. 6,362,992.

As can also be seen by comparing FIGS. 1–3, a common feature of CAM (and many other parallel comparison circuits, for that matter) is the use of a match line (ML). Only a few memory cells are shown in the examples, with all in a single row connected to only a single match line. In actual practice, there typically will be thousands of cells in each row and hundreds or thousands of such rows, each having a respective match line. Each such match line is pre-charged with a voltage and when a match condition occurs the match line discharges, nominally to ground. Conceptually similar circuits can be constructed, but are not common, where the match line is pre-grounded and a match condition causes charging to some voltage level which is detected. Unfortunately, these approaches to match detection have a number of problems.

One can consider just one row. In view of the large number of cells present, it should be clear that the match line for such a row will have an appreciable capacitance. The pre-charge sub-circuit (e.g., MP0 in FIG. 1) has to handle this, and will typically take up a relatively large amount of die space or "real estate." The row also necessarily operates at a particular clock rate, performing pre-charging, comparison, and match detection in each cycle. In this approach, the match line necessarily also runs at that clock frequency. However, as those skilled in the electronic arts also accept as a maxim, it is generally desirable to reduce sub-circuit frequency wherever possible, while maintaining overall system frequency. Lower operating frequency typically correlates with reduced power consumption, component life, etc. Additionally, switching high power and reactive loads at high frequency is undesirable because of possible collateral effects due to electro-magnetic radiation.

In summary, it is desirable to have a more flexible CAM, which can be efficiently applied as either binary or ternary CAM. It is also desirable to have CAM, in the form of binary CAM, ternary CAM, or configurable binary-ternary CAM, which consumes less power. And it is further desirable to have CAM which operates sub-circuits at low effective frequency, particularly including the match line sub-circuit.

DISCLOSURE OF INVENTION

Accordingly, it is an object of the present invention to provide a CAM which is configurable to operate in either binary mode or ternary mode, yet which is efficiently able to utilize all memory cells in either mode.

Another object of the invention is to provide a CAM which provides substantial power savings.

Briefly, one preferred embodiment of the present invention is a content addressable memory (CAM). The CAM includes an input sub-circuit to present input data to multiple cell sub-circuits. A further included match sub-circuit has a match-high line, a match-low line, and a pre-charge sub-circuit. The pre-charge sub-circuit is able to connect the match-high line to a voltage source, to charge it, and also to connect the match-low line to a ground, to discharge it. The cell sub-circuits each compare one bit of the input data with one bit of pre-stored storage data and determine whether pre-specified match criteria are met. If so, the cell sub-circuit connects the match-high line and match-low line, thereby signaling detection of a mismatch condition.

Briefly, another preferred embodiment of the present invention is a content addressable memory (CAM) for binary mode comparison of input bits with storage bits. The CAM includes an input sub-circuit to present the input bits to multiple cell sub-circuits. A further included match sub-circuit has a match-high line, a match-low line, a pre-charge sub-circuit, and multiple match-gates, at least equaling the cell sub-circuits in number. The pre-charge sub-circuit is able to controllably bring the match-high line to a high state and the match-low line to a low state. Each match-gate is able to operationally connect the match-high line with the match-low line in response to a match signal. The cell sub-circuits each store one of the storage bits and generate a respective match signal based on the states of the input bit and its storage bit, thereby permitting the CAM to compare the input bits with the storage bits to detect a mismatch condition.

Briefly, another preferred embodiment of the present invention is a content addressable memory (CAM) for ternary mode comparison of input bits with storage bits. The CAM includes an input sub-circuit to present the input bits to multiple composite cells. A further included match sub-circuit has a match circuit including a match-high line, a match-low line, a pre-charge sub-circuit, and multiple match-gates, at least equaling the cell sub-circuits in number. The pre-charge sub-circuit is able to controllably bring the match-high line to a high state and the match-low line to a low state. Each match-gate is able to operationally connect the match-high line with the match-low line in response to a match signal. The composite cells each store one of the storage bits and one of the mask bits as a ternary unit having three possible states: 1, 0, and X, wherein X represents masked. The composite cells then each generate a respective match signal based on the states of the input bit and the ternary unit, thereby permitting the CAM to compare one of the input bits with one of the storage bits and one of the mask bits to detect a mismatch condition.

And, briefly, another preferred embodiment of the present invention is a content addressable memory (CAM) for comparison of a data set in either binary mode or ternary mode. The CAM includes an input circuit suitable for presenting input bits from the data set to multiple composite cells. A further included match circuit has a match-high line, a match-low line, a pre-charge sub-circuit, and multiple match-gates, at least equaling the composite cells in number. The pre-charge sub-circuit is able to controllably bring the match-high line to a high state and the match-low line to a low state. Each match-gate is able to operationally connect the match-high line with the match-low line in response to a match signal. The composite cells selectively operate in either the binary mode or the ternary mode. In the binary mode, each composite cell stores two storage bits, receives two input bits from the input circuit, and generates two match signals respectively based on the states of an input bit and a storage bit, thereby permitting the CAM to compare the data set with the storage bits in binary manner to detect a mismatch condition. In the ternary mode, each composite cell stores one storage bit and one mask bit as a ternary unit having three possible states: 1, 0, and X, wherein X represents masked. The composite cells each receive one input bit from the input circuit and generate a respective match signal based on the states of the input bit and the ternary unit, thereby also permitting the CAM to compare the data set with the storage bits and the mask bits in ternary manner to detect a mismatch condition.

An advantage of the present invention is that it provides a CAM that is configurable to operate in either binary mode or ternary mode while efficiently utilizing all memory cells.

Another advantage of the invention is that it provides substantial power savings in input data handling, by floating signals that do not need to be changed, and thereby not requiring reconditioning (charging or discharging) of those signals for later use.

And another advantage of the invention is that it halves the operation rate or frequency of key sub-circuits which handle and consume substantial power. This directly avoids direct adverse frequency related effects in the CAM, such as electromagnetic interference. Concurrently, this provides substantial further power savings in match detection, by reduced operation of large devices and capacitances, while still providing match detection capability during every clock cycle.

These and other objects and advantages of the present invention will become clear to those skilled in the art in view of the description of the best presently known mode of carrying out the invention and the industrial applicability of the preferred embodiment as described herein and as illustrated in the several figures of the drawings.

BRIEF DESCRIPTION OF THE DRAWINGS

The purposes and advantages of the present invention will be apparent from the following detailed description in conjunction with the appended figures of drawings in which.

In the various figures of the drawings, like references are used to denote like or similar elements or steps.

DETAILED DESCRIPTION

Figure 1:
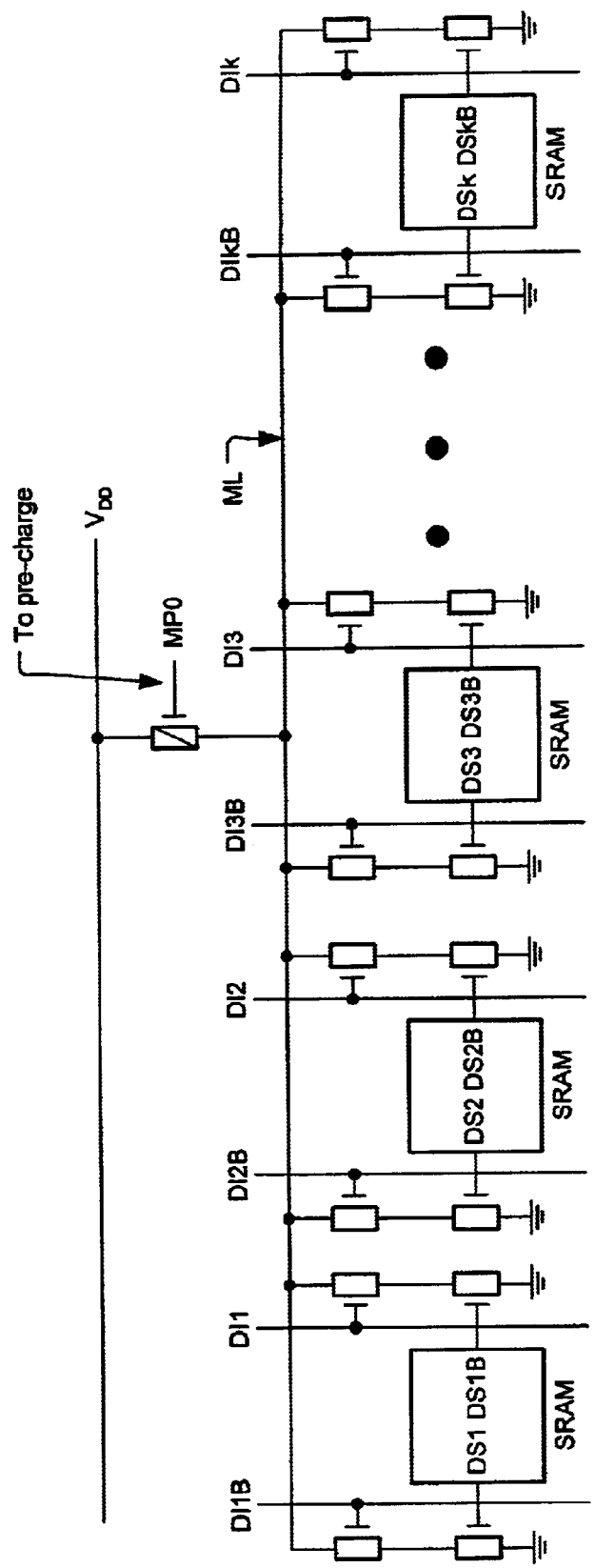
FIG. 1 (background art) is a schematic diagram showing a typical word in a conventional binary CAM.

Best Mode for Carrying out the Invention

A preferred embodiment of the present invention is a dual-match line, twin-cell binary-ternary CAM. As illustrated in the various drawings herein, and particularly in the view of FIG. 4, embodiments of the invention are depicted by the general reference character 10.

Figure 2:
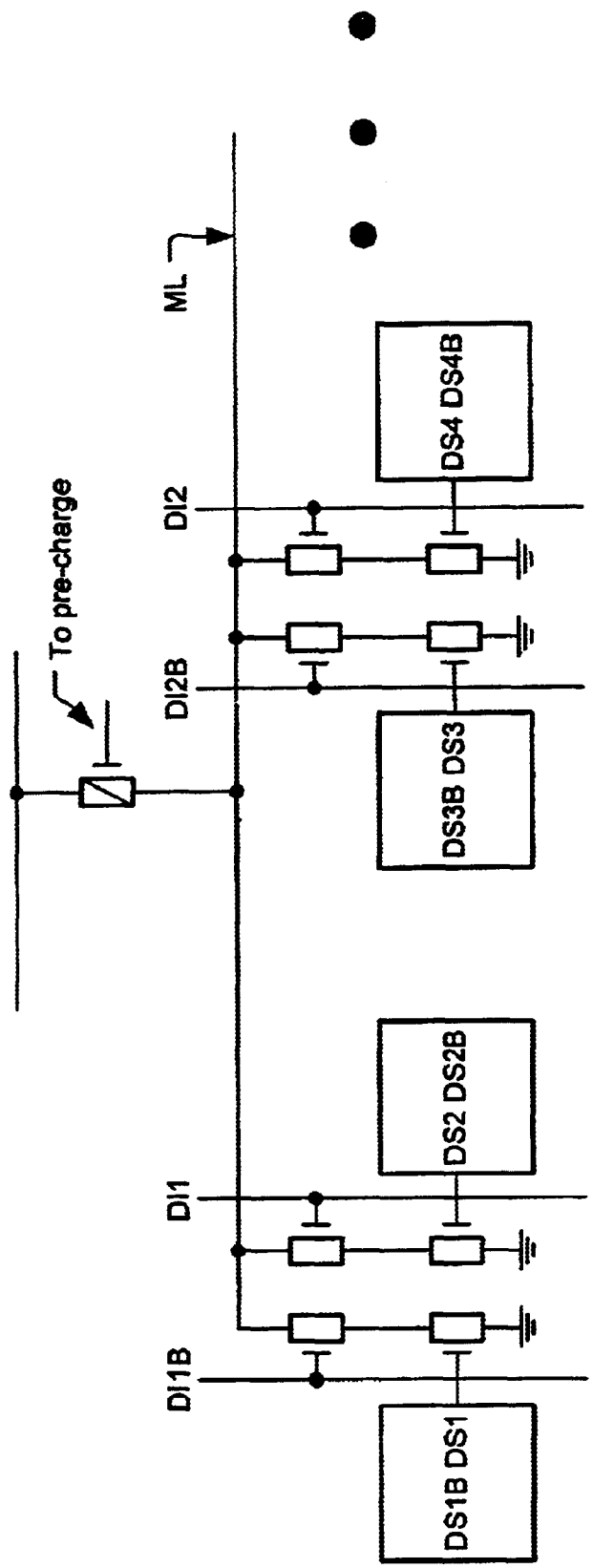
FIG. 2 (background art) is a schematic diagram showing a typical word in a conventional ternary CAM.
Figure 3:
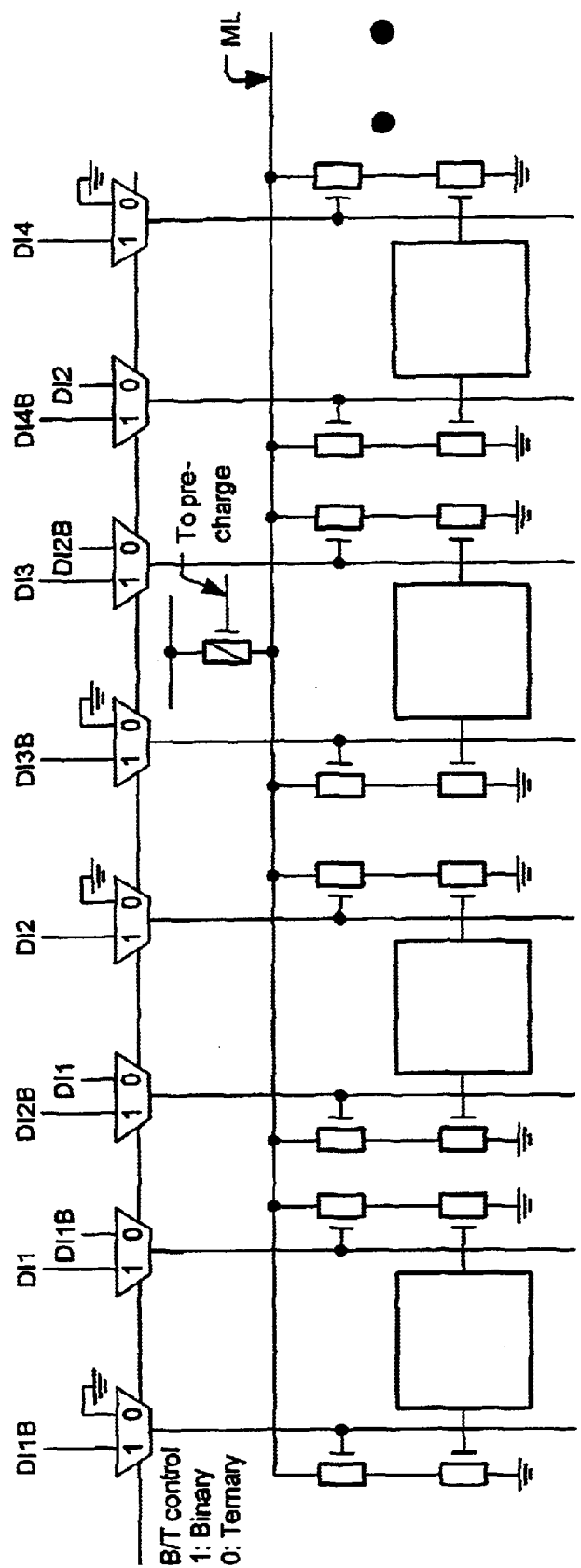
FIG. 3 is a schematic diagram showing a word in a dual-function CAM, a binary-ternary CAM.

In applications where both binary and ternary CAM is required on a single chip, it is important that both binary and ternary modes are supported in the most efficient manner. One method to implement such a "dual function" CAM is shown in FIG. 3. The layout of the CAM array here is identical to that of a binary CAM, so that it functions exactly like a binary CAM when required. To use the array as a ternary CAM, one may simply ground the unused differential lines and feed the input word through the central data-in lines with multiplexers, as shown. The result is then a ternary cell, which functions exactly the same as the case in FIG. 2.

It is thus apparent that such utilization of a twin-cell to perform binary/ternary dual functions can be accomplished as long as differential signals are available and the two SRAM cells used can be encoded into three states. The present invention uses such a concept, and at the same time saves dynamic power as is now described.

Figure 4:
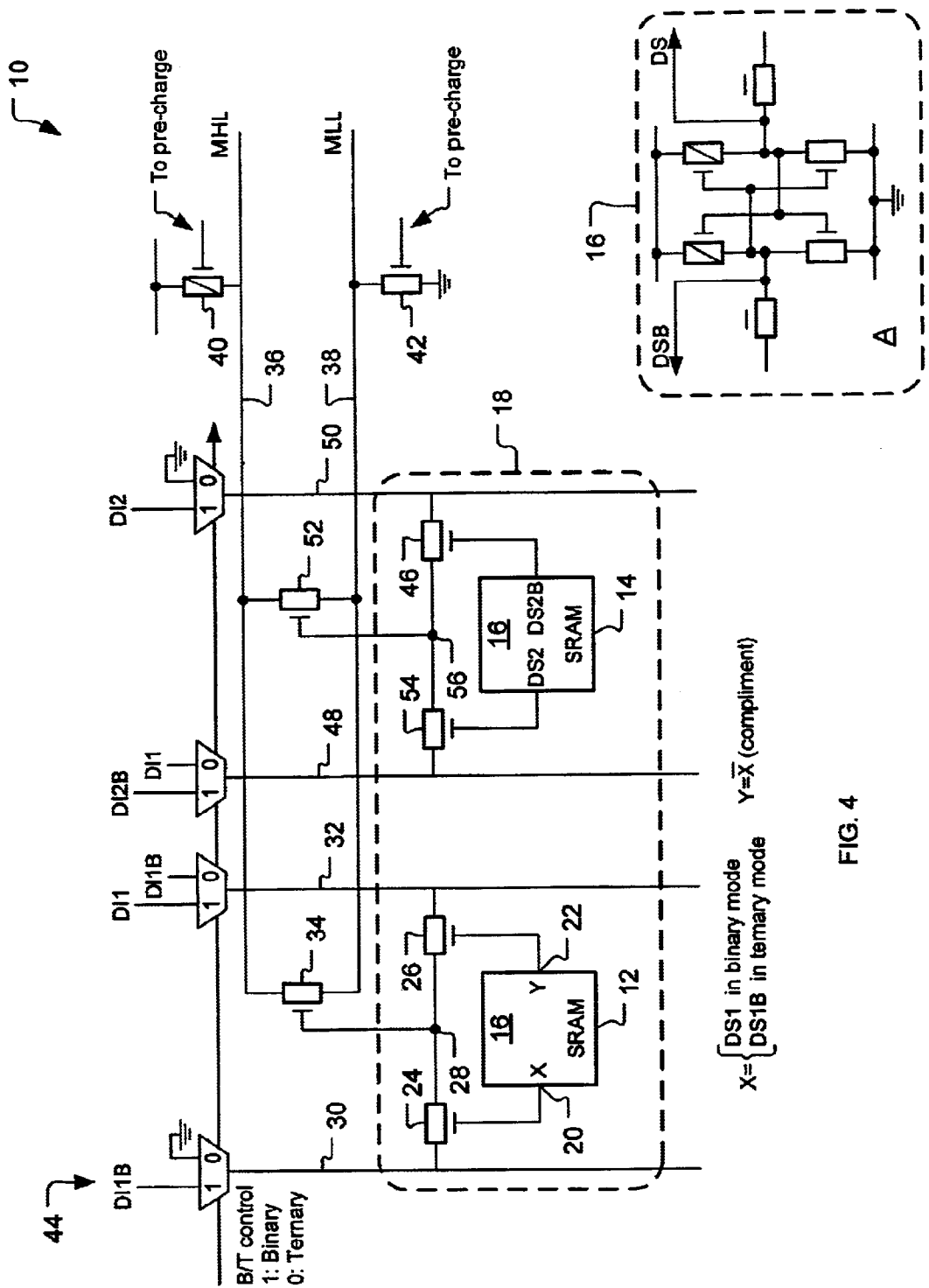
FIG. 4 is schematic diagram showing a word in a binary-ternary CAM according to the present invention.

Consider the circuit shown in FIG. 4. The dual-function, twin-cell binary-ternary CAM (CAM 10) in this circuit consists of two identical sub-circuits: sub-circuit 12 and sub-circuit 14, each of which stores a single bit of information in a SRAM cell 16. Circuitry for storing the bits of information in the SRAM cells 16 has been omitted here for clarity in presenting the salient points of the invention, but such circuitry may be entirely conventional in any case.

Collectively a pair of the sub-circuits 12, 14 form a composite cell 18. Internal details of one possible SRAM cell 16 are shown in insert A.

In binary mode, each SRAM cell 16 provides two states and the sub-circuits 12, 14 behave as two independent binary CAM cells. By combining the sub-circuits 12, 14 and properly encoding the four states provided by the two SRAM cells 16, however, it is possible to store and detect the three states required by the ternary mode.

Let us consider the binary mode first. Since the sub-circuits 12, 14 operate independently, it suffices to investigate only the sub-circuit 12. A cross-coupled pair inside the SRAM cell 16 defines two states: a "1" state with a X node 20 high (DS1=1) and a Y node 22 low (DS1B=0), and a "0" state with the X node 20 low (DS1=0) and the Y node 22 high (DS1B=1). Note that these nodes 20, 22 (DS1, DS1B here in binary mode) respectively control a first pass gate 24 and a second pass gate 26. When the SRAM cell 16 is in the "1" state, the X node 20 is high and a third node 28 follows an input line 30 (Dl1B), and when the SRAM cell 16 is in the "0" state, the Y node 22 is high and the third node 28 follows an input line 32 (Dl1). Together, the X node 20 and the input line 32 (DS1 and Dl1) form an EXCLUSIVE OR logic function. The third node 28, in turn, controls a first match gate 34. Once this first match gate 34 is turned on, the potential of a match-high line 36 (MHL) and a match-low line 38 (MLL) equalize.

Each compare cycle consists of three phases: a data input phase, a compare phase, and a sampling phase. During the first phase, the data input phase, the CAM 10 is initialized to one of two possible states and data is input to it through the data-in sub-circuit 44. The two possible states are a charged-high state and a charged-low state. The CAM 10 is in the charged-high state when a first pre-charge device 40 is turned on and a second pre-charge device 42 is turned off. The match-high line 36 then goes high and the match-low line 38 floats. The CAM 10 is in the charged-low state when the first pre-charge device 40 is turned off and the second pre-charge device 42 is turned on. The match-high line 36 then floats and the match-low line 38 goes low.

Under control of the data-in sub-circuit 44 a data bit is driven on the input lines 30, 32 differentially (as Dl1B and Dl1). When the SRAM cell 16 is in the "1" state (DS1=1, DS1B=0) the first pass gate 24 is on and the third node 28 follows the input line 30 (Dl1B). If the input line 32 is high (Dl1=1), the input line 30 (Dl1B) is low and the first match gate 34 is off. This is a match condition. Alternately, if the input line 32 is low (Dl1=0) the input line 30 (Dl1B=1) is high, so the third node 28 will go high and the first match gate 34 will turn on. This is a mismatch condition.

Similarly if the SRAM cell 16 is in the "0" state (DS1=0, DS1B=1), the second pass gate 26 is on and the third node 28 follows the input line 32 (Dl1). The first match gate 34 is off and a match condition now occurs if the input line 32 is low (Dl1=0). Whereas, the first match gate 34 is on and a mismatch condition occurs if the input line 32 is high (Dl1=1).

At the end of the first phase, the input data should be stable and all of the match gates 34 for a given row of SRAM cells 16 should be turned either on or off. The changing of the polarity of pre-charge signal marks the beginning of the second phase, the compare phase. During this phase, the first pre-charge device 40 and second pre-charge device 42 change from on to off, or from off to on, depending on their previous states. Since in a CAM array the SRAM cells 16 of an entire row are connected to the match-high line 36 and the match-low line 38, it takes just one single non-matching cell unit, like sub-circuit 12, to equalize the match-high line 36 to the match-low line 38. On the other hand, the match-high line 36 stays high only if all of the bits in the SRAM cells 16 match the bits appearing in the data-in sub-circuit 44. In other words, if any match gate 34 is turned on in a given row, i.e., a mismatch condition; the match-high line 36 and match-low line 38 will be equalized, and both signals will stay either high or low, depending on the pre-charge condition. If no match gate 34 in a row is turned on, i.e., a match condition; the match-high line 36 will stay high and the match-low line 38 will stay low.

After both of the match lines 36, 38 settle down, the third phase begins, the sample phase. The rising edge of a clock signal (FIG. 5) marks the beginning of this phase. During this phase, a sense amplifier (FIG. 5) samples both of the match lines 36, 38. If they are the same a mismatch condition exists, and if the match-high line 36 is high and the match-low line 38 is low a match condition exists.

In ternary mode, each compare cycle can also be viewed as having three phases: a data input phase, a compare phase, and a sampling phase. During the first phase, the data input phase, the CAM 10 is initialized to one of two possible states and data is input to the CAM through the data-in sub-circuit 44. A data bit drives the input line 32 and an input line 48 differentially (Dl Band Dl1) and the input line 30 and an input line 50 are driven to ground.

The SRAM cells 16 in the sub-circuits 12, 14 (CK1 and CK2) are combined such that the composite cell 18 forms three states: a "1" state where (DS1, DS2)=(1, 0); a "0" state where (DS1, DS2)=(0, 1); and a "DON'T CARE" state where (DS1, DS2)=(0, 0). The state (DS1, DS2)=(1, 1) is not allowed. In these expressions a "1" means a high voltage and "0" means a low voltage, as is customary in this art.

If the composite cell 18 is in the "1" state, the second pass gate 26 is on and a third pass gate 54 is off. If Dl=1, the input line 32 (Dl1B) will be low and the input line 48 (Dl1) will be high. Both the third node 28 and a fifth node 56 are low, and both of the first match gate 34 and a second match gate 52 are off. This is a match condition. On the other hand, if Dl=0, the input line 32 (Dl1B) will be high and the input line 48 (Dl1) will be low. The third node 28 will then follow the input line 32 (Dl1B), turning on the first match gate 34. This is therefore a mismatch condition. Similar analysis will show the validity for the case of the "0" state. For the "DON'T CARE" state, since both the second pass gate 26 and the third pass gate 54 are off, the match gates 34, 52 are off. A match condition is therefore guaranteed. It follows that by appropriate multiplexing and by encoding the states of the composite cell 18, the two binary SRAM cells 16 behave like a single ternary cell.

At the end of the first phase, the input data should be stable and all of the match gates 34, 52 for a given row should be either on or off. The changing of the polarity of pre-charge signal marks the beginning of the second phase, the compare phase. During this phase, much the same as in the binary mode, the pre-charge devices 40, 42 change from on to off, or from off to on, depending on their previous states. Since the SRAM cells 16 of a whole row in a CAM array are connected to the match lines 36, 38, it takes only one single non-matching cell unit, like the sub-circuit 12, to equalize the match lines 36, 38. On the other hand, the match-high line 36 stays high only if all bits in the SRAM cells 16 match the bits appearing in the data-in sub-circuit 44. In other words, if any match gate 34, 52 is turned on in a given row, i.e., a mismatch condition exists; the match lines 36, 38 will be equalized and both will stay either high or low. If no match gate 34, 52 in a row is turned on, i.e., a match condition exists; the match-high line 36 will stay high and the match-low line 38 will stay low.

After both of the match lines 36, 38 settle down, the third phase begins, the sample phase. This is also much the same as in the binary mode; the rising edge of the clock (FIG. 5) marks the beginning of this phase. During this phase, the sense amplifier (FIG. 5) samples both of the match lines 36, 38. If they are the same a mismatch condition exists, and if the match-high line 36 is high and the match-low line 38 is low a match condition exists.

Since either of the match lines is floating during the data input phase, the data-in lines do not have to be connected to the ground. In the case an input data bit does not change from one compare cycle to the next no dynamic power is consumed by the data-in lines during the data input phase. Since there usually are many data-in lines that do not change, this aspect of the present inventive CAM 10 provides a substantial power savings.

Figure 5:
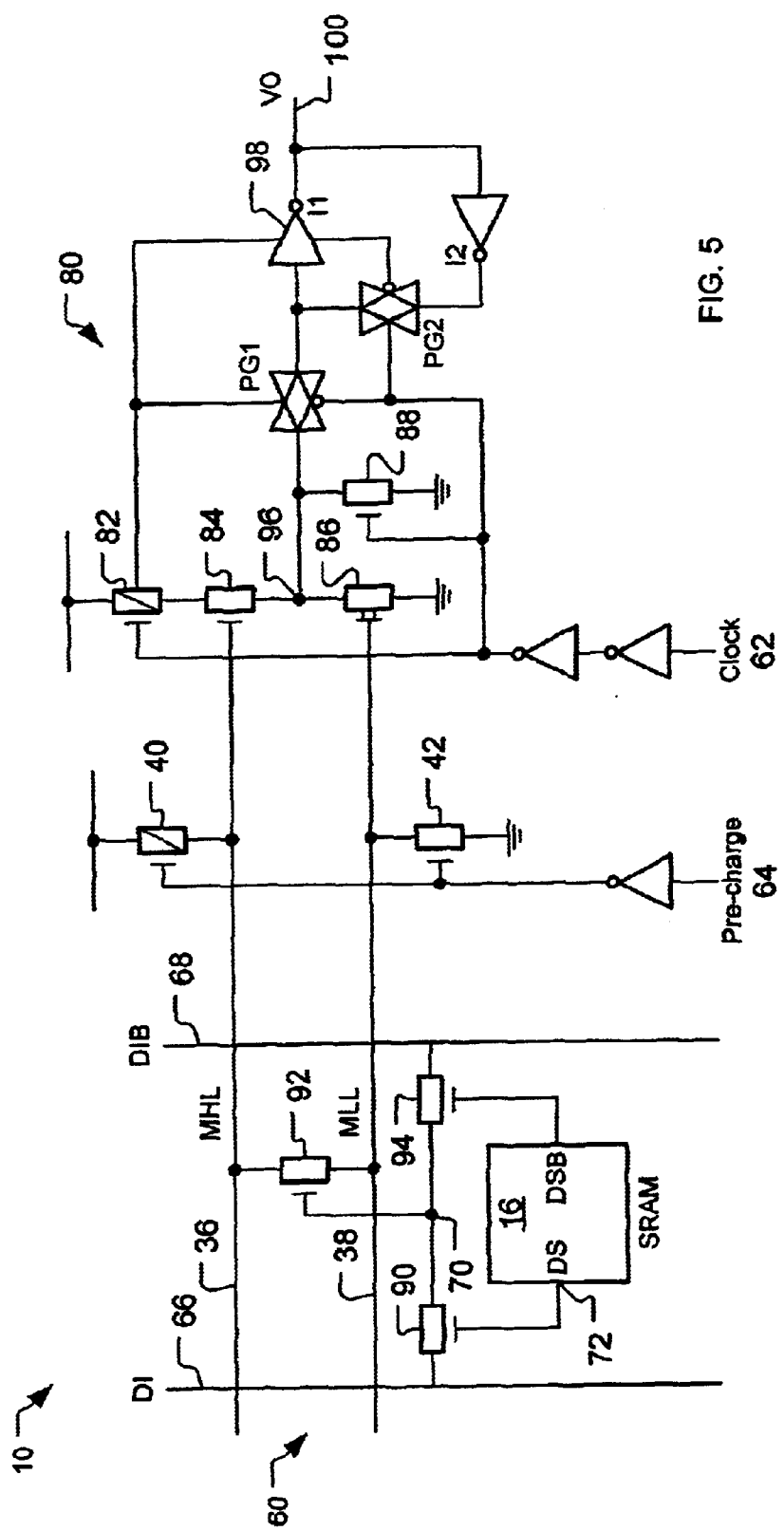
FIG. 5 is schematic diagram particularly showing one suitable match detection decoding circuit which may be used in the binary-ternary CAM.
Figure 6:
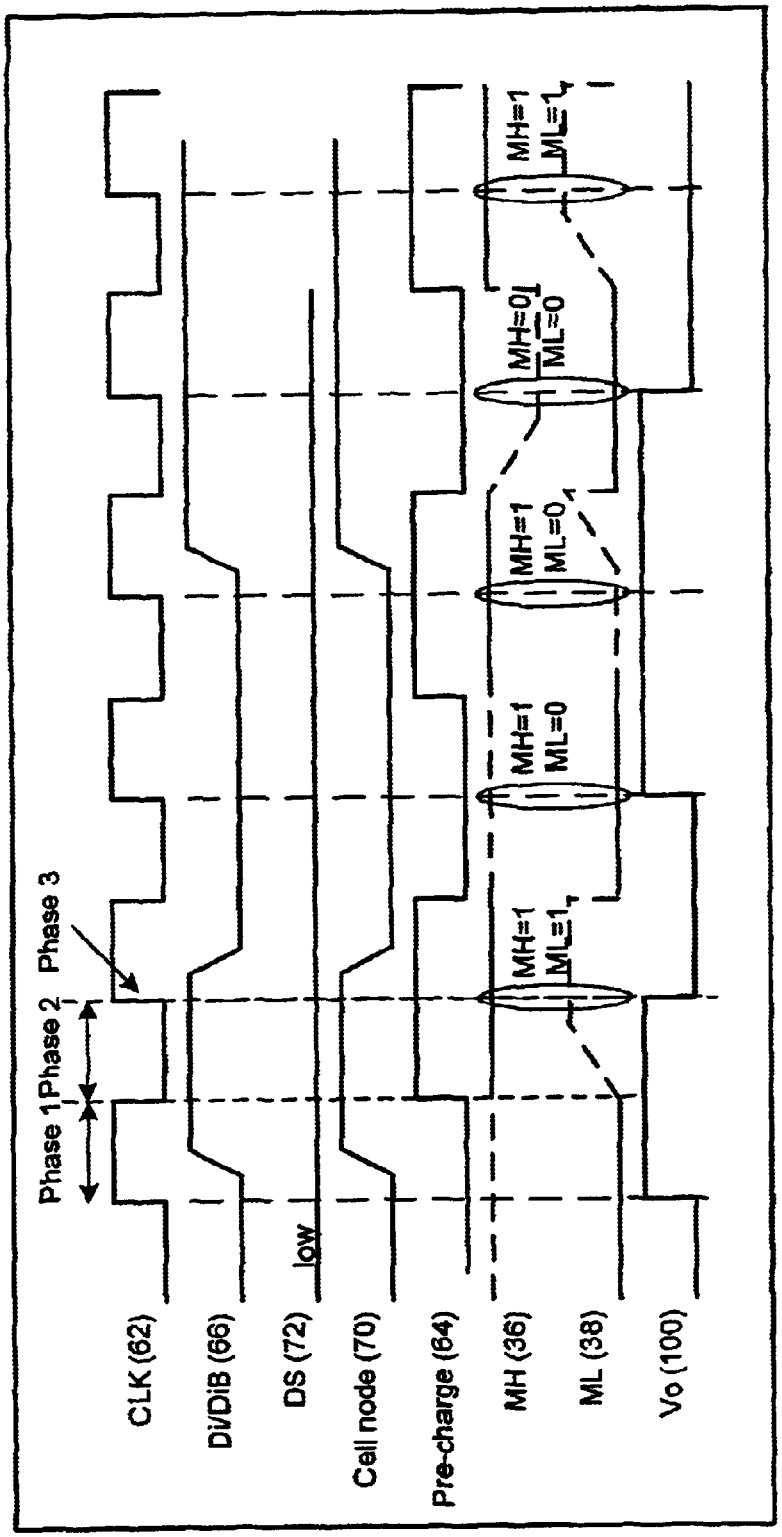
FIG. 6 is a timing diagram depicting signal relationships at various points in the circuit shown in FIG. 5.

FIG. 5 is a schematic diagram particularly showing one suitable decoding circuit 60 for match detection, which may be used in the CAM 10, such as that depicted in FIG. 4. For simplicity only one CAM cell is shown, together with the decoding circuit 60. FIG. 6 is a timing diagram depicting signal relationships at various points in the circuit shown in FIG. 5.

As shown in FIG. 6 a clock signal 62 is provided and a pre-charge signal 64 in the decoding circuit 60 is basically the clock signal 62 divided-by-two. Note that the pre-charge signal 64 in this embodiment follows the falling edge of the clock signal 62 and switches either low-to-high or high-to-low once every clock cycle. At the rising edge of the clock signal 62, data-in drives a Dl line 66 (and its differentially related DlB line 68 in FIG. 5; e.g., signals on input lines 30, 32, 48 in FIG. 4), and stays valid throughout the whole clock cycle. The levels of the match-high line 36 (MHL) and the match-low line 38 (MLL) are then sensed during the low time of each cycle of the clock signal 62 and latched by the rising edge of the next clock cycle.

With reference also to FIG. 4, a cell node 70 (e.g., the third node 28 or the fifth node 56) exhibits the EXCLUSIVE OR function of a DS node 72 (e.g., the X node 20 (DS in FIG. 5) and the Dl line 66 (e.g., input lines 32, 48). For simplicity it is assumed that the DS node 72 is low (DS=0) all of the time and that the Dl line 66 switches. As shown in FIG. 6, whenever the Dl line 66 and the DS node 72 are different (Dl≠DS), the cell node 70 goes high and brings the match-high line 36 (MHL) and the match-low line 38 (MLL) together, so that (MHL, MLL)=(0, 0) or (1, 1) at the end of each cycle of the clock signal 62, depending on the level of the pre-charge signal 64 (1 or 0). This is the non-match condition.

On the other hand, if Dl line 66 and the DS node 72 are the same (Dl=DS), the cell node 70 is low and the match-high line 36 is cut off from the match-low line 38. Since the pre-charge signal 64 always switches once during each clock cycle, the match-high line 36 is charged high and the match-low line 38 is discharged low during the clock cycle and (MHL, MLL)=(1, 0) at the rising edge of the next clock cycle. This is therefore the match condition.

Since the pre-charge signal 64 switches at half the rate of the clock signal 62, the dynamic power consumed by large devices, like the pre-charge devices 40, 42, and large capacitances like the match-high line 36 and the match-low line 38 are all cut by half, as compared with the conventional method in which pre-charge and detection occur during every clock cycle. As power consumption in CAM is closely related to the pre-charge rate, this aspect of the inventive CAM 10 accordingly provides yet more substantial power savings.

As those skilled in the electronic arts are well aware, reducing the rate or frequency of operation of circuits, all or in part, provides a veritable cornucopia of benefits. For instance, lower speed components may be used and signal interference is reduced between components and the circuit environment, generally. Additionally, when both power savings and frequency reduction can be concurrently achieved, the benefit is often synergistically increased.

Next let us consider a sensing sub-circuit 80 consisting of devices 82, 84, 86, and 88. Notice that the match-low line 38 follows the D1 line 66 or the D1B line 68 through two gates, the D1 pass gate 90 and the match gate 92, or the D1B pass gate 94 and the match gate 92. Its high level is therefore $V_{DD}-2*V_{TN}$ where $V_{TN}$ is the threshold voltage of an NMOS device (in this embodiment), and is typically rather low. For device 86 a natural NMOS device having a threshold voltage that is nominally positive, but around "0," is preferably used. With device 84 and device 86 an AND function controlled by the match-high line 36 is formed at an AND node 96. To avoid a worst case in which the threshold voltage of the device 86 goes slightly negative, and hence never cuts off, the device 82 is preferably a PMOS type and is used to supply power during sensing, while the device 88 post-conditions (discharges) the AND node 96 after sensing. Care must be taken that the switching threshold of an inverter 98 lies within the switching window of the AND node 96 under all circuit conditions. As shown in FIG. 6, a resulting latched voltage 100 (VO) goes high when a match occurs.

Using a natural device for device 86 is a recommendation. However, say, in a case where such is not available, more conventional methods can also be considered, including using PMOS devices for pass-gates 90, 94.

In summary, as has been described above particularly with respect to FIG. 4, the present CAM 10 can be configured, as desired, to function as a binary or ternary type CAM. And as has also been described, particularly with respect to FIG. 5–6, the CAM 10 provides substantial power savings in two particular regards. It should be appreciated, however, that the necessarily limited examples which can be presented in a discussion such as this cannot depict all possible details of all possible embodiments of the invention. For example, the examples used have employed SRAM type memory cells, but those skilled in the art will appreciate that the present invention has applicability with many other types of memory. Similarly, while a dual-function binary-ternary CAM has been presented as the inventor's presently preferred embodiment, there is no reason why the approaches to power saving and sub-circuit frequency reduction taught herein cannot also be applied to single function CAM of either binary or ternary types. Indeed, since match detection is widely used with circuitry other than CAM, there is no reason why the approaches to match detection taught herein cannot also be used with such other circuitry.

Figure 7:
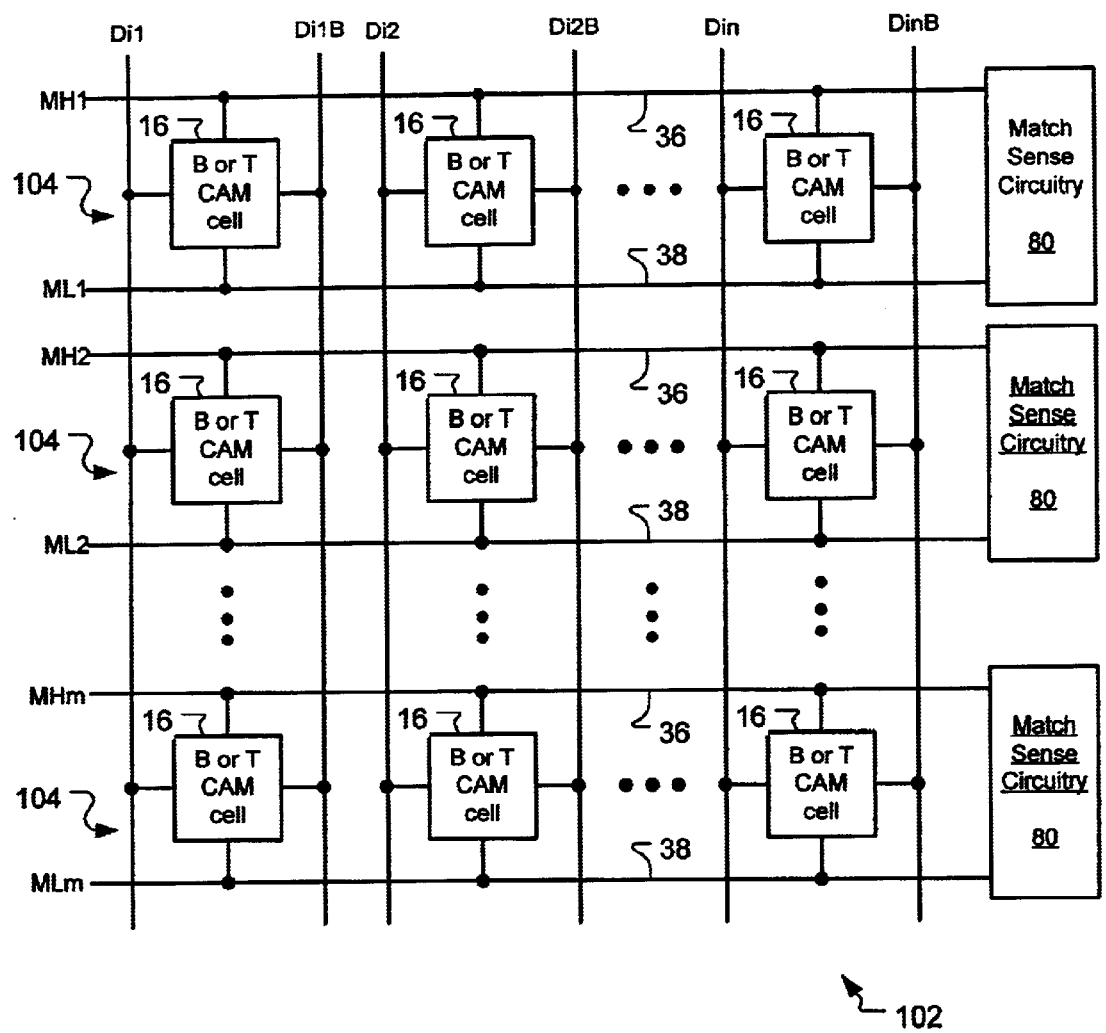
FIG. 7 is a block diagram showing the binary-ternary CAM applied in the context of a larger CAM having rows.

FIG. 7 is a block diagram showing the SRAM cells 16 of the CAM 10 extended in to the context of a larger CAM 102 having a plurality of rows 104. Accordingly, it can be seen that the present invention can be applied in large CAM based memory schemes, as is increasingly common.

Figure 8:
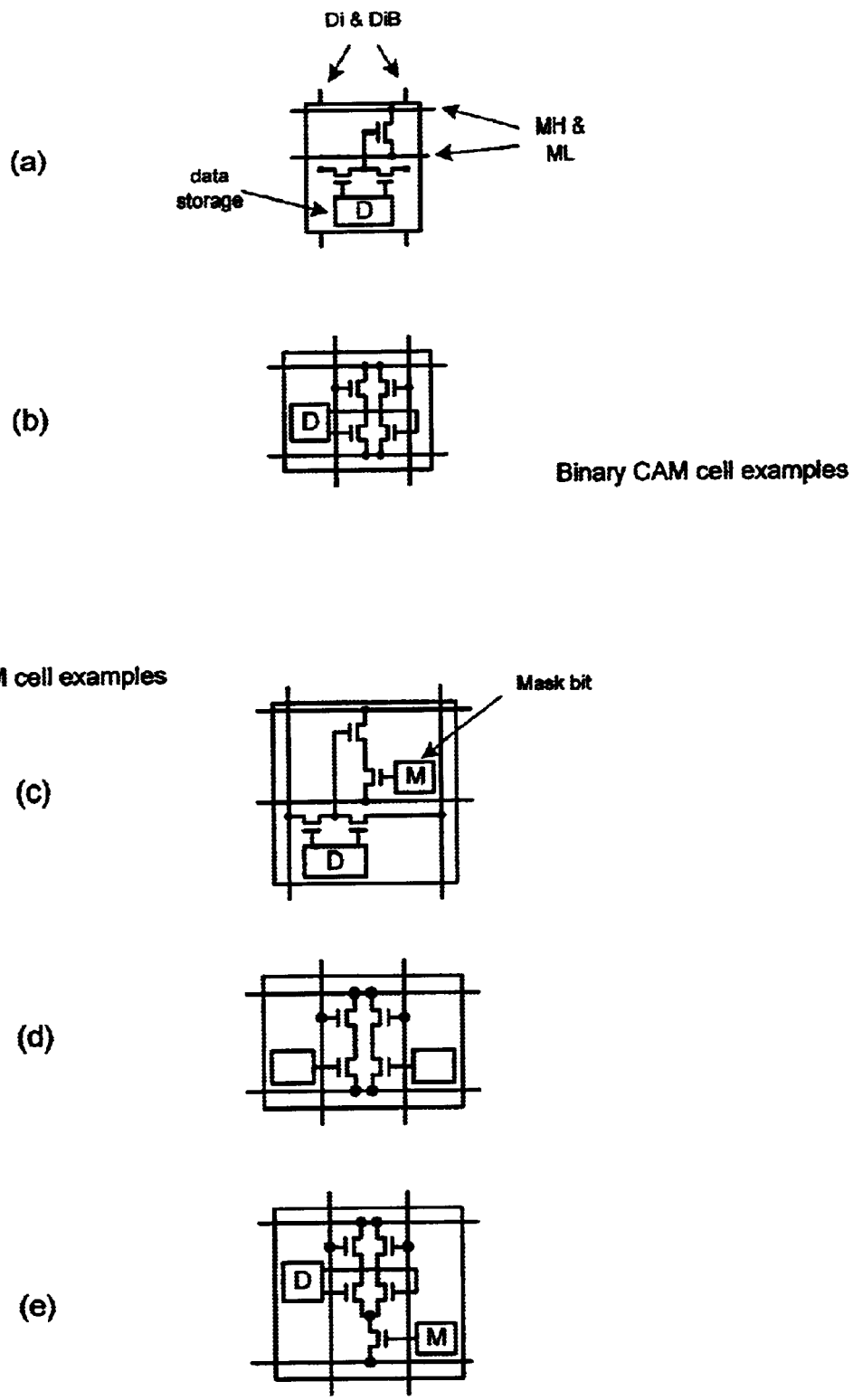
FIG. 8 is a series of schematic diagrams showing examples of generally conventional binary and ternary cells improved by addition of a match detection scheme according to the present invention.

Finally, FIG. 8 is a series of schematic diagrams showing examples of generally conventional binary and ternary cells improved by addition of a match detection scheme according to the present invention. Internal details of binary CAM cells are shown in items (a) and (b), and internal details of ternary CAM cells are shown in items (c), (d) and (e).

Accordingly, while various embodiments have been described above, it should be understood that they have been presented by way of example only, and not limitation. Thus, the breadth and scope of the invention should not be limited by any of the above described exemplary embodiments, but should be defined only in accordance with the following claims and their equivalents.

INDUSTRIAL APPLICABILITY

The present CAM 10 is well suited for use in a wide variety of applications. Comparing FIG. 1 (background art) and FIG. 4 reveals that when used as binary CAM, the CAM 10 employs a different gate arrangement than is conventional. By employing three gates in association with each memory cell, power savings is achieved in two particular manners. Firstly, the lines (MHL, MLL) used for match detection are floated, so that the input data lines do not have to be grounded. Secondly, the lines (MHL, MLL) used for match detection are operated at half of the overall clock frequency. Comparing FIG. 2 (background art) and FIG. 4 similarly reveals that when used as ternary CAM, the CAM 10 also employs a non-conventional gate arrangement. But again, this provides the dual types of power savings discussed above. Comparing FIG. 3 and FIG. 4 reveals yet a further distinction. As discussed elsewhere, FIG. 3 depicts a logical approach to implementing a binary-ternary CAM. However, rather than use four gates per memory cell as in FIG. 3, the invention may employ only three gates per cell and be used as a binary-ternary CAM which additionally provides the noted power savings. Accordingly, the inventive CAM 10 may be implemented as a binary CAM, a ternary CAM, or a selectively configurable binary-ternary CAM and it may provide substantial benefits in all of these roles.

In straight forward manner the principals of the CAM 10 may be extended and used in larger schemes, such as the CAM 102 of FIG. 7 in which a number of cells are arranged into multiple rows, each having a common match sensing sub-circuit. Arrangement in columns or into sub arrays is likewise possible. The CAM 10 may also be implemented in a wide range of conventional memory and logic types, using essentially conventional manufacturing processes. This, in turn, facilitates immediate application of the inventive CAM 10 in discrete integrated circuits and modules, or as a sub-part of larger assemblies such as Systems on a Chip (SoC).

The range of ultimate uses for CAM is also wide, and growing very rapidly, so a detailed discussion is not possible. But one particularly promising area of use for the present CAM 10 that deserves mention is in portable devices. Such devices often require sparing use of power and the inventive CAM 10 clearly excels over conventional CAM in this regard.

For the above, and other reasons, it is expected that the CAM 10 of the present invention will have widespread industrial applicability. Therefore, it is expected that the commercial utility of the present invention will be extensive and long lasting.

What is claimed is:

1. A content addressable memory (CAM), comprising:
   an input circuit suitable for presenting input data to a plurality of cell circuits;
   a match circuit including a match-high line, a match-low line, and a pre-charge sub-circuit able to controllably connect said match-high line to a voltage source and to controllably connect said match-low line to a ground, thereby charging said match-high line and discharging said match-low line; and
   said plurality of cell circuits each able to compare one bit of said input data with one bit of pre-stored storage data to determine whether pre-specified match criteria are met, and to operationally connect said match-high line and said match-low line if said match criteria are met, thereby permitting detection of a mismatch condition.

2. The CAM of claim 1, further comprising a clock suitable for cycling at a clock frequency, and wherein:
   said plurality of cell circuits each perform one comparison per cycle of said clock; and said pre-charge sub-circuit connects said match-high line to said voltage source and said match-low line to said ground at half of said clock frequency.

3. The CAM of claim 1, wherein said match criteria define a binary mode comparison between said one bit of said input data and said one bit of pre-stored storage data.

4. The CAM of claim 1, wherein said match criteria define a ternary mode comparison between said one bit of said input data, said one bit of pre-stored storage data, and one bit of pre-stored mask data.

5. The CAM of claim 1, wherein said input circuit controllably specifies whether said match criteria define a binary mode comparison or a ternary mode comparison.

6. The CAM of claim 1, wherein a plurality of said plurality of cell circuits define rows such that each said row has a respective common said match circuit, thereby permitting comparison of said input data and a plurality of instances of said pre-stored storage data.

7. A method for comparing input data with pre-stored storage data in an associative manner, the method comprising the steps of:
(a) pre-charging a match-high line to a high state and a match-low line to a low state;
(b) presenting the input data to a plurality of cell circuits;
(c) comparing one bit of the input data with one bit of the pre-stored storage data in each of said plurality of cell circuits to determine whether pre-specified match criteria are met; and
(d) connecting said match-high line and said match-low line if said match criteria are met, thereby permitting detection of a mismatch condition.

8. The method of claim 7, wherein:
said step (c) occurs at a clock frequency; and
step (a) includes pre-charging said match-high line and said match-low line at half of said clock frequency.

9. The method of claim 7, wherein said step (C) includes binary mode comparison between said one bit of the input data and said one bit of the pre-stored storage data.

10. The method of claim 7, wherein said step (c) includes ternary mode comparison between said one bit of the input data, said one bit of the pre-stored storage data, and one bit of pre-stored mask data.

11. The method of claim 7, further comprising (e) specifying whether said match criteria define a binary mode comparison or a ternary mode comparison.

12. A content addressable memory (CAM) for binary mode comparison of input bits with storage bits, comprising:
an input circuit suitable for presenting the input bits to a plurality of cell circuits;
a match circuit including a match-high line, a match-low line, a pre-charge sub-circuit able to controllably bring said match-high line to a high state and said match-low line to a low state, and a plurality of match-gates at least equaling said plurality of cell circuits, wherein each said match-gate is able to operationally connect said match-high line with said match-low line in response to a match signal; and
said plurality of cell circuits each suitable for:
storing one of the storage bits; and
generating a said match signal based on the states of the input bit and its storage bit, thereby permitting the CAM to compare the input bits with the storage bits to detect a mismatch condition.

13. The CAM of claim 12, further comprising a clock suitable for cycling at a clock frequency, and wherein:
said input circuit presents the input bits to said plurality of cell circuits at said clock frequency; and
said pre-charge sub-circuit operates at half of said clock frequency.

14. The CAM of claim 12, wherein a plurality of said plurality of cell circuits define rows such that each said row has a respective common said match circuit, thereby permitting comparison of said input data and a plurality of instances of said storage data.

15. A method for comparing input bits with storage bits in a binary associative manner, the method comprising the steps of:
(a) pre-charging a match-high line to a high state and a match-low line to a low state;
(b) storing each of the storage bits in a respective memory cell;
(c) generating respective match signals based on the states of the input bits and said memory cells; and
(d) connecting said match-high line and said match-low line responsive to any one of said match signals, thereby comparing each of the input bits with each of the storage bits to detect a mismatch condition.

16. The method of claim 15, wherein:
said step (c) occurs at a clock frequency; and
said step (a) occurs at half of said clock frequency.

17. A content addressable memory (CAM) for ternary mode comparison of input bits with storage bits and mask bits, comprising:
an input circuit suitable for presenting the input bits to a plurality of composite cells;
a match circuit including a match-high line, a match-low line, a pre-charge sub-circuit able to controllably bring said match-high line to a high state and said match-low line to a low state, and a plurality of match-gates at least equaling said plurality of cell circuits, wherein each said match-gate is able to operationally connect said match-high line with said match-low line in response to a match signal; and
said plurality of composite cells each suitable for:
storing one of the storage bits and one of the mask bits as a ternary unit having three possible states (1, 0, and X, wherein X represents masked); and
generating a said match signal based on the states of the input bit and said ternary unit, thereby permitting the CAM to compare one of the input bits with one of the storage bits and one of the mask bits to detect a mismatch condition.

18. The CAM of claim 17, further comprising a clock suitable for cycling at a clock frequency, and wherein:
said input circuit presents the input bits to said plurality of composite cells at said clock frequency; and
said pre-charge sub-circuit operates at half of said clock frequency.

19. The CAM of claim 17, wherein a plurality of said plurality of cell circuits define rows such that each said row has a respective common said match circuit, thereby permitting comparison of said input data and a plurality of instances of said storage data.

20. A method for comparing input bits with storage bits and mask bits in a ternary associative manner, the method comprising the steps of:
(a) pre-charging a match-high line to a high state and a match-low line to a low state;
(b) storing the storage bits and the mask bits in composite cells as a ternary units having one of three possible states (1, 0, and X, wherein X represents masked);
(c) generating respective match signals based on the states of the input bits and said composite cells; and (d) connecting said match-high line and said match-low line responsive to any one of said match signals, thereby comparing each of the input bits with each of the storage bits to detect a mismatch condition.

21. The method of claim 20, wherein:

said step (c) occurs at a clock frequency; and said step (a) occurs at half of said clock frequency.

22. A content addressable memory (CAM) for comparison of a data set in either binary mode or ternary mode, comprising:

an input circuit suitable for presenting input bits from the data set to a plurality of composite cells;

a match circuit including a match-high line, a match-low line, a pre-charge sub-circuit able to controllably bring said match-high line to a high state and said match-low line to a low state, and a plurality of match-gates at least equaling said plurality of composite cells, wherein each said match-gate is able to operationally connect said match-high line with said match-low line in response to a match signal; and said plurality of composite cells each suitable for selective operation in either the binary mode or the ternary mode, wherein:

in the binary mode each said composite cell is suitable for:

storing two storage bits;

receiving two said input bits from said input circuit; and generating two said match signals respectively based on the states of a said input bit and a said storage bit, thereby permitting the CAM to compare the data set with said storage bits in binary manner to detect a mismatch condition; and in the ternary mode each said composite cell is suitable for:

storing one storage bit and one mask bit as a ternary unit having three possible states (1, 0, and X, wherein X represents masked);

receiving one said input bit from said input circuit; and generating a said match signal based on the states of said input bit and said ternary unit, thereby also permitting the CAM to compare the data set with said storage bits and said mask bits in ternary manner to detect a mismatch condition.

23. The CAM of claim 22, further comprising a clock suitable for cycling at a clock frequency, and wherein:

said input circuit presents said input bits to said plurality of composite cells at said clock frequency; and said pre-charge sub-circuit operates at half of said clock frequency.

24. The CAM of claim 22, wherein a plurality of said plurality of composite cells define rows, thereby permitting comparison of said data set with a plurality of sets of said storage bits in the binary mode and with a plurality of sets of said storage bits and said mask bits in the ternary mode.

25. A method for comparison of a data set in either binary or ternary associative manner, the method comprising the steps of:

(a) pre-charging a match-high line to a high state and a match-low line to a low state;

(b) selecting operation in either the binary mode or the ternary mode;

(c) in the binary mode:
    (1) storing two storage bits in a composite cell
    (2) selecting two input bits from the data set; and
    (3) generating a match signal based on the states of said input bits and said storage bits; and (d) in the ternary mode:
    (1) storing a storage bit and a mask bit in said composite cell as a ternary unit having one of three possible states (1, 0, and X, wherein X represents masked);
    (2) selecting one input bit from the data set; and
    (3) generating said match signal based on the states of said input bit and said ternary unit; and (e) connecting said match-high line and said match-low line responsive to any one of said match signals, thereby permitting the CAM to compare the data set with said storage bits in binary manner to detect a match and to also compare the data set with said storage bits and said mask bits in ternary manner to detect a mismatch condition.

26. The method of claim 25, wherein:

said step (c)(3) and said step (d)(3) occur at a clock frequency; and said step (a) occurs at half of said frequency.

* * * * *